(12) United States Patent
Gupta

(10) Patent No.: US 6,542,829 B1
(45) Date of Patent: Apr. 1, 2003

(54) CHARACTERIZATION OF MICROELECTROMECHANICAL STRUCTURES

(75) Inventor: Raj K. Gupta, San Francisco, CA (US)

(73) Assignee: Coventor, Inc., Cary, NC (US)

( * ) Notice: Subject to any disclaimer, the term of this patent is extended or adjusted under 35 U.S.C. 154(b) by 154 days.

(21) Appl. No.: 09/668,013

(22) Filed: Sep. 21, 2000

Related U.S. Application Data

(60) Provisional application No. 60/155,339, filed on Sep. 22, 1999.

(51) Int. Cl.$^7$ .............................. G01B 3/00; H01L 29/82
(52) U.S. Cl. ....................... 702/33; 73/514.21; 257/415; 700/97; 703/2; 716/5
(58) Field of Search .............................. 702/33, 34, 35, 702/117; 73/514.21, 654; 257/417; 324/71.5; 359/223, 298; 367/35

(56) References Cited

U.S. PATENT DOCUMENTS

| | | | | |
|---|---|---|---|---|
| 5,786,621 A | * | 7/1998 | Saif et al. ................... | 257/415 |
| 6,116,766 A | * | 9/2000 | Maseeh et al. ............... | 700/97 |
| 6,157,900 A | * | 12/2000 | Maseeh ......................... | 703/2 |
| 6,220,096 B1 | * | 4/2001 | Gutierrez et al. ......... | 73/514.21 |
| 6,330,704 B1 | * | 12/2001 | Ljung et al. .................... | 716/5 |

OTHER PUBLICATIONS

Biebl et al., "Young's Modulus of in–situ Phosphorus–doped Polysilicon," *Proceedings of Transducers 1995*, vol. II, pp. 80–83, Stockholm, Sweden, Jun. 1995.

Fedder et al., "Automated Optimal Synthesis Of Microresonators," *Transducers '97*, 1997 International Conference on Solid–State Senors and Actuators, Chicago, Jun. 16–19, 1997, pp. 1109–1112.

Gupta, "Electro Pull–In Test Structure Design for In–Situ Mechanical Property Measurements of Microelectromechanical Systems (MEMS)," Ph.D Thesis, Jun. 1997, M.I.T., Cambridge, MA.

Hartog, J.P.D., *Mechanical Vibrations*, 4th edition reprint, Dover Publishing, Inc., Mineola, NY (1985) ISBN 0–486–64785–4.

Kahn et al., "Mechanical Properties of Thick, Surface Micromachined Polysilicon Films,"*Proceedings IEEE MEMS 1996*, San Diego, CA Feb. 11–15, 1996, pp. 343–348.

Pratt et al., "Characterization of Thin Films Using Micromechanical Structures," *Materials Research Society Symposium Proceedings*, 276:197–202 (1992).

Press et al., *Numerical Recipies in Fortran 77, second edition*, Cambridge University Press, pp. 674–683 (1992).

(List continued on next page.)

*Primary Examiner*—Kamini Shah
*Assistant Examiner*—John Le
(74) *Attorney, Agent, or Firm*—Jenkins & Wilson, P.A.

(57) ABSTRACT

Accurate characterization of microelectromechanical systems (MEMS) geometry is critical for device design and simulation, for material property extraction, and for post-fabrication trimming. According to the present embodiment, a method for characterizing parameters describing MEMS structures resulting from the fabrication process or process variations is presented. According to the prefered embodiment, experimentally obtained natural frequencies are compared with numerical simulations to identify unknown values of structural parameters or parameter variations. Further, the prefered embodiment teaches how electrostatically-driven laterally resonant comb-drive MEMS test structures with prescribed changes in spring width are used to characterize systematic variations in process offsets and sidewall angles. The disclosed technique is both in-situ and non-destructive.

13 Claims, 13 Drawing Sheets

OTHER PUBLICATIONS

Schmidt et al., "Silicon Resonant Microsensors," *Ceramic Engineering and Science Proceedings*, 8(9–10):1019–1034 (1987).

Schmidt et al., *Understanding Industrial Designed Experiments*, Cover Page and Table of Contents, Air Academy Press, (1992).

Tang, William C., "Electrostatic Comb Drive for Resonant Sensor and Actuator Applications," Ph.D Thesis, University of California at Berkeley (1990).

Wang et al., "High–Order Micromechanical Electronic Filters," *10th IEEE International Workshop on MEMS 1997*, Nagoya, Japan, Jan. 26–30, 1997, pp. 25–30.

* cited by examiner

FiG·2

| Device Type | Critical Factor | Functional Dependence |
|---|---|---|
| Lateral comb drives | $\delta_{max}$ $\delta_{max}$ Q | $L^3/Etw^3$ $\rho L^3/Ew^3$ $(Et^2w^3L^3\rho)^{1/2}$ |
| Plates Membranes | $\delta_{max}$ $S_m$ | $(1-\nu^2)R^4/Et^3$ $\sim R^2/\sigma t$ |
| Torsional hinges | $V_{PI}$ $\delta\theta_{max}$ | $\sim (Gt^2w^2g^3/L)^{1/2}$ $\sim L/Gt^2w^2$ |
| Electrostatic Parallel-plate devices | $F_{bal}$ $t_{PI}$ $V_{PI}$ | $\rho Et^3w/g^2$ $(\rho/Et^2)^{1/2}$ $(Et^3g^3/L^4)^{1/2}$ |

Fig. 6

CHARACTERIZATION OF MICROELECTROMECHANICAL STRUCTURES

CROSS REFERENCE TO RELATED APPLICATIONS

This application is a non-provisional application of U.S. provisional patent application entitled "CHARACTERIZATION OF MICROELECTROMECHANICAL STRUCTURES," U.S. Ser. No. 60/155,339 filed Sep. 22, 1999, having Rajesh K. Gupta named as inventor. The No. 60/155,339 application is hereby incorporated by reference in its entirety.

BACKGROUND OF THE INVENTION

1. Field of the Invention

A method for characterizing parameters describing microelectromechanical (MEMS) structures resulting from a device fabrication process or process variations is presented.

2. Description of Related Art

Monitoring the geometry of fabricated MEMS devices is as fundamentally important to predicting and evaluating device performance as tracking the material properties of the devices or variations in the device fabrication processes. Accurate knowledge and predictability regarding MEMS device geometries can improve device yields and reduce the need for post-fabrication processes such as trimming to achieve targeted device performance specifications. Although material properties generally affect critical performance parameters linearly, device geometry affects device performance characteristics to much higher powers, i.e., the critical performance characteristics of fabricated MEMS devices are generally much more sensitive to variations in device geometry than to variations in material properties. FIG. 6 summarizes mathematically the extent to which material properties and device geometry affect common critical performance parameters for several different MEMS devices. As can be seen, geometric parameters such as length (L) and width (w) affect critical performance parameters such as mechanical displacement or mechanical force by as much as the third or fourth power, whereas material properties such as density or modulus of elasticity generally only affect such parameters to the first power, i.e., linearly.

Unknown and undesired variations in device geometry can also adversely affect the methods used to extract material properties for MEMS devices from MEMS test structures. Typically, values of selected material properties are extracted from such test structures by physically measuring intermediate parameters, such as pull-in voltages, resonant frequencies, and maximum deflections. The measured values of the intermediate parameters can then be mathematically reduced to derive the desired material property values. However, the measured values of the intermediate parameters depend on device geometry and are sensitive to variations in fabricated geometric dimensions. It is desirable to eliminate such variations as much as possible so that data reduction from the intermediate parameters results in an accurate determination of the values of the selected material properties. The uncertainty introduced by variations in the fabricated geometric dimensions in such test structures is significant and introduces at least first-order errors in the inferred values of the material properties. Variations in geometric dimensions as large as 20% compared to nominal values can easily propagate to errors in extracted material property data as high as 100%.

Conventionally, measurements of MEMS geometries are accomplished ex-situ, and include the use of SEM's, surface profilometers, ellipsometers, and interferometers. However, conventional ex-situ measurement techniques have various limitations and drawbacks. In some cases, measurements can be made to better than 5% accuracy, provided calibration standards for the measurement devices are carefully adhered to. This is particularly essential with respect to SEMs and surface profilometers. In addition, with a SEM, care is needed to align the viewing angle to be orthogonal to the surface of the device being measured, otherwise scaling offsets will be introduced in the dimensional measurements. Ellipsometers are specific to the substrates and layers used in device fabrication and are therefore of limited use. Further, ellipsometers require a laser spot size bigger than typical MEMS devices. Single-wavelength ($\lambda$) interferometers may be useful for measuring certain geometric parameters. However, when depth measurements smaller than $\lambda/8$ are required, errors can be introduced if the measurement techniques employed do not adjust for imperfect reflection off a device's surface or for thin-film effects resulting from internal reflection within a region of varying thickness or a gap region underneath the device. This may happen with polysilicon and other materials commonly used to fabricate MEMS when they are fabricated less than 3 $\mu$m thick and are partially transmissive at the optical wavelengths commonly used in interferometers.

In-situ electronic test structures for monitoring fabricated MEMS geometries and material properties are attractive because they offer ease of use, the repeatability and control of voltage application, compatibility with standard IC wafer-level probing techniques, limited device area requirements, and integration with real devices. In-situ measurement is especially useful for monitoring material properties which can be highly process-dependent. Mechanical property test structures using in-situ electrostatic actuation include beams and diaphragms actuated to pull-in, laterally resonant comb-drives, vertically resonant beams, and capacitance-voltage measurements of fixed-fixed beam bridges. Non-electrostatic methods for mechanical property measurement include load-deflection and bulge tests of membranes, measuring cantilever tip displacement with an externally applied force, and direct tensile measurement of strain. Non-electrostatic methods are typically carried out ex-situ, and require either specialized structures with modifications or additions to the fabrication process, or special apparatuses to make measurements and apply external forces.

Clearly, the ability to independently characterize the geometry of MEMS devices is essential to accurate, efficient, and successful device design, simulation, and material property extraction. Current methods of ex-situ and in-situ characterization have a variety of limitations and drawbacks. The present invention presents an approach for providing device geometry characterization which overcomes the limitations and drawbacks of the current methods and which advantageously relies only on an optical microscope and standard electronic test equipment used at the wafer-level for independent measurement of geometry.

Other work relevant to characterizing MEMS structures includes the following references, some of which are referred to by reference number in the following sections:

1. Raj K. Gupta, "Electrostatic Pull-in Test Structure Design for Mechanical Property Characterization of Microelectromechanical Systems (MEMS)", Ph.D. Thesis, June 1997, M.I.T., Cambridge, Mass.
2. William C. Tang, "Electrostatic Comb Drive for Resonant Sensor and Actuator Applications", Ph.D. Thesis, University of California at Berkeley, 1990.

3. R. I. Pratt, G. C. Johnson, R. T. Howe, and D. J. Nikkel, Jr., "Characterization of Thin Films Using Micromechanical Structures", Materials Research Society Symposium Proceedings, 276 (1992) pp. 197–202.
4. H. Kahn, S. Stemmer, K. Nandakumar, A. H. Heuer, R. L. Mullen, R. Ballarini, and M. A. Huff, "Mechanical Properties of Thick, Surface Micromachined Polysilicon Films", Proceedings IEEE MEMS 1996, San Diego, Calif., Feb. 11–15, 1996, pp. 343–348.
5. M. Biebl, G. Brandl, and R. T. Howe, "Young's Modulus of in-situ Phosphorus-doped Polysilicon", Proceedings of Transducers' 1995, Volume II, Stockholm, SWEDEN, June 1995, pp. 80–83.
6. Jacob P. Den Hartog, "Mechanical Vibrations", Fourth Edition reprint, Dover Publishing, Inc., Mineola, N.Y., USA, 1985, ISBN 0-486-64785-4.
7. M. A. Schmidt and R. T. Howe, "Silicon Resonant Microsensors", Ceramic Engineering and Science Proceedings, 8, No. 9–10, September–October 1987, pp. 1019–1034.
8. G. K. Fedder, S. Iyer, and T. Mukherjee, "Automated Optimal Synthesis of Microresonators", Proceedings of Transducers' 97, Volume II, Chicago, Ill., USA, Jun. 16–19, 1997, pp. 1109–1112.
9. K. Wang and C. T.-C. Nguyen, "High-Order Micromechanical Electronic Filters", Tenth IEEE International Workshop on MEMS 1997, Nagoya, JAPAN, Jan. 26–30, 1997, pp. 25–30.
10. MEMCAD software is available from Microcosm Technologies, Inc., Cary, N.C.
11. W. H. Press, S. A. Teukolsky, W. T. Vetterling, and B. P. Flannery, Numerical Recipes in C, Second Edition, Cambridge University Press, 1992, pp. 681–688.
12. S. R. Schmidt and R. G. Launsby, Understanding Industrial Designed Experiments, Air Academy Press, 1992.

The present invention advantageously addresses the need for independent, in-situ, wafer-level measurement of MEMS device geometry using electronic test structures. The approach of the invention is flexible and may be employed with a variety of known MEMS structures, including variations on the conventional comb-drive resonator structure, a solid model of which is shown in FIG. 9. The present invention avoids the drawbacks and limitations of known in-situ and ex-situ methods by exploiting the known sensitivity of readily measurable mechanical parameters of the chosen test structure to variations in the nominal values of selected geometric dimensions of the structure. This relationship can then be used to quantify unknown values of microscopic variations in the same geometric dimensions of similar fabricated devices. For example, the resonant frequency of the comb-drive resonator structure of FIG. 9 is known to be sensitive to certain geometric parameters such as sidewall angle θ 206 and edge bias woff 205, which are defined in FIG. 10. Similar physical parameters which are sensitive to other geometric parameters can be identified for other MEMS structures if desired. For the resonator structure shown in FIG. 9, the change in resonant frequencies due to typical manufacturing variations in sidewall angle θ 206 and edge bias woff 205 are shown in FIG. 12a and FIG. 12b. The relationship between geometric parameters and resonant frequencies are taught in Reference [6].

In the present invention, the unknown dimensional values of selected geometric parameters in fabricated MEMS structures can be extracted by first fabricating a number of similar test structures in which the dimensional values of the selected geometric parameters are varied by a known amount. For example, a number of comb-drive test structures can be fabricated with varying values of mask-drawn, i.e., nominal, geometric parameters such as width wo 309 and length L 308 (see FIGS. 7, 8, and 10). The resonant frequencies of the test structures can then be physically measured using known techniques. Known models are then applied to the observed resonant frequencies and are fit to the set of selected geometric parameters of unknown value in order to quantify them. The same approach may be used to quantify unknown values of selected material parameters or unknown values of process parameters. The fit assumes uniformity of processing of the test structures, thus eliminating as factors variations in a significant number of geometric parameters that could otherwise impact the outcome and avoiding the need for geometric calibration. For example, in the case of the comb-drive test structure, the fit assumes that the etched sidewall profiles, material and process are uniform across the devices measured. This is generally a suitable assumption in the case of similarly oriented devices fabricated on the same chip or wafer.

Resonant frequency models for the lateral natural frequency fH 505 of comb-drive MEMS structures have been investigated using analytical techniques and reported in References 2, 3, 4, 5, 6, 7, 8, and 9. The present invention extends these models by adding refinement with 3D analysis and a careful consideration of geometry. In particular, the extended models of the invention include the effects of (1) inertia and stiffness changes due to edge bias and sidewall angles, (2) compliant supports, (3) a distributed mass, (4) residual biaxial stress, and (5) the input of mask-drawn tether width variations on the preferred embodiment of a comb-finger MEMS structure.

As will be appreciated by those skilled in the art, the approach of the present invention is advantageous in that it only requires making prescribed changes in geometry at the photolithographic mask level rather than at the device level, and can be used with any MEMS structure which is mechanically sensitive to variations in geometric parameters and any suitable and accurate force-displacement measurement technique. The use of resonant frequency measurements is particularly advantageous and desirable since such measurements tend to limit nonlinear coupling between the drive force and mechanical response which can result from application of a strong drive. As is well known, for example, coupling of a strong electrostatic drive to the mechanics can introduce electromechanical "spring softening," and in extreme cases causes pull-in, and in comb-drives can cause levitation for an in-plane drive.

SUMMARY OF THE INVENTION

The present invention provides a method and apparatus to characterize MEMS structures which can be used to determine the unknown values of device geometric parameters resulting from the device fabrication process or process variations. The methods and apparatus use controlled variations of selected geometric parameters of a single test structure design to obviate the need for independent geometric calibration, and the extraction approach employed allows measurements of geometry perturbations at a level of precision limited only by the minimum feature size of the fabrication process being used. The method and apparatus achieve a high degree of accuracy by using numerical analysis models which carefully consider geometry and residual stress.

In one preferred form of the invention, the nominal geometries of a MEMS structure, such as a resonant comb-drive, are selected such that a physically measurable performance parameter, such as the natural frequency fo of the device will fall within an experimentally measurable range.

A method of numerical analyses is used to accurately calculate the value of the selected performance parameter, e.g., natural frequency fo, of the structure from the nominal values of selected geometric parameters, such as thickness to, width wo, and gap go, and from selected independently measured mechanical properties, such as density $\rho$, modulus of elasticity E, residual stress $\sigma$o, and poisson's ratio v. To calculate the natural frequency fo, for example, it is sufficient to know the ratio E/$\rho$. Also, knowing $\sigma$o(1−v) is sufficient to estimate changes in the natural frequency due to residual stress. Ideally the actual thickness t and gap g would be used to calculate natural frequency fo, but the error in not knowing the exact values is sufficiently minor that it may be ignored in most applications.

A set of photolithographic masks for a set of test structures are designed. The masks are designed to have varying trial values for the selected geometric parameters, the trial values being selected to encompass the entire range over which the unknown values of the selected geometric or material parameters as fabricated can be independently monitored. This range typically should include the smallest feature width w that can be fabricated using the lithography process.

The test structures are fabricated and a set of experimentally observed values for the selected performance parameter, e.g. a set of natural frequencies, is obtained. For example, observed frequencies may include lateral natural frequency fL, lateral natural frequency fH, and torsional natural frequency fT, which are all dependent on the selected trial values. This set of experimentally observed performance parameter values, e.g., natural frequencies, is compared with the calculated values of models described by the trial values. Minimizing the error measure between the experimentally observed values and calculated values results in high-accuracy numerical approximations of the unknown parameters.

A preferred form of the present invention utilizes the lateral resonant mode in the MEMS comb-drive resonator 102 based on the mask layout in FIG. 7. Not only does the lateral resonant mode have a large sensitivity to process description parameters edge bias woff 205 and sidewall angle $\theta$ 206 (see FIG. 12a and FIG. 12b), but this mode is easy to experimentally excite and to detect. In addition the lateral resonant mode is first-order insensitive to fabricated thickness variations, especially for small sidewall angles.

The comb-drive resonator 102 is suitable to illustrate a preferred form of the invention because of its wide-spread use in the MEMS community and because it demonstrates how the geometric extraction technique of the invention can be applied to fabricated parts. However, the present invention is not limited to use with the particular comb-drive resonator structure illustrated herein and is sufficiently general to be applied to most geometric design variations of the comb-drive resonators presented in literature, as well as other MEMS structures, including designs for surface micromachining, LIGA, crystal-silicon wafer bonding, and bulk micromachining.

BRIEF DESCRIPTION OF DRAWINGS

FIG. 6 is a table which shows the dependence of critical device performance parameters on geometry and material properties for typical MEMS device types.

DETAILED DESCRIPTION OF PREFERRED EMBODIMENT

A presently preferred embodiment of the present invention is discussed below with reference to the accompanying drawings. In the following description, numerous specific details are set forth in order to provide a thorough understanding of the presently preferred embodiment of the present invention. It will be obvious, however, to those skilled in the art that the present invention is not limited to the specific details and may be practiced with various modifications, omissions and additions thereto. For economy and clarity, similar structures are referenced throughout the drawings with the same reference numbers and in some instances, detailed depictions of well-known structures are omitted in order to avoid unnecessarily obscuring the present invention.

Figure 1:
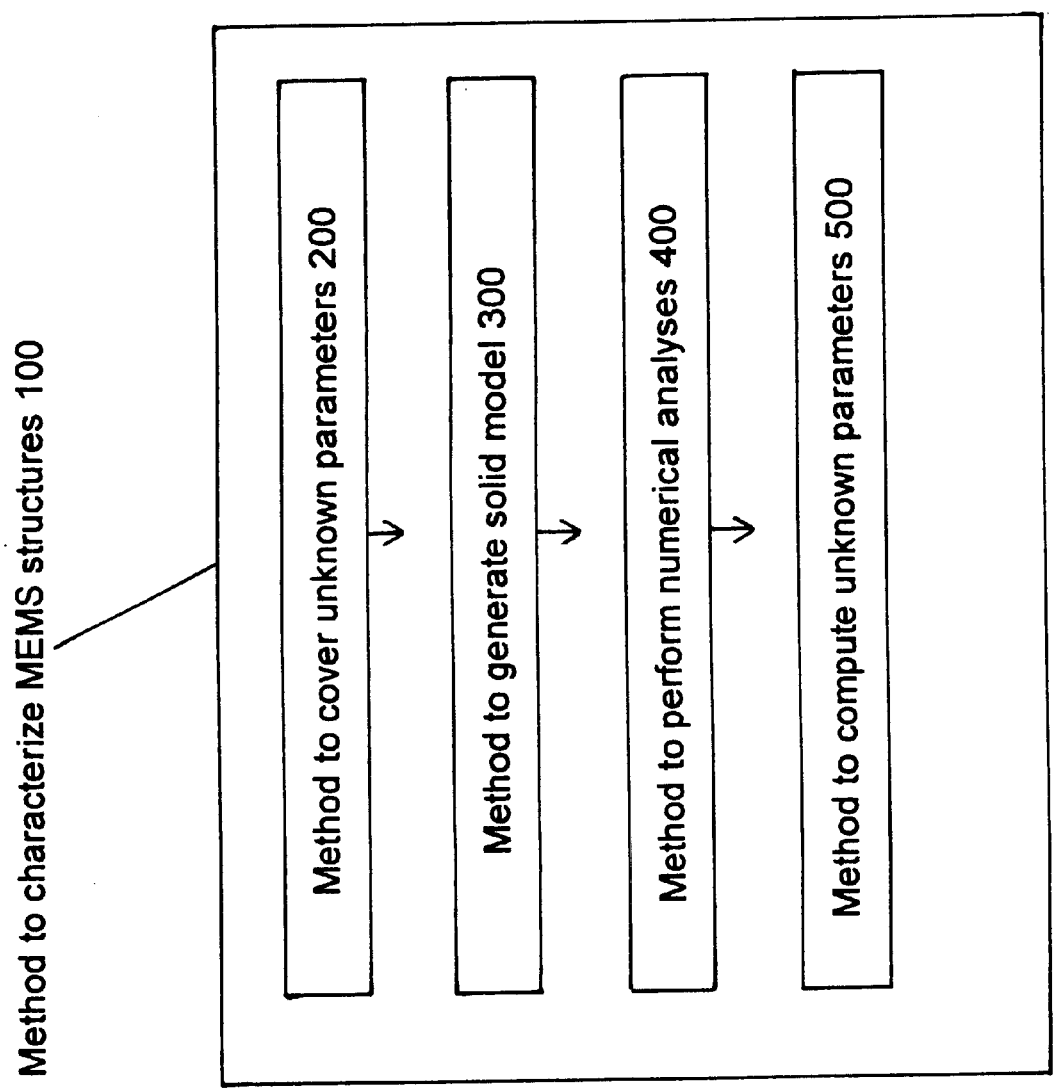
FIG. 1 is a flowchart of a preferred general method and components to characterize MEMS structures.

FIG. 1 generally illustrates a preferred method and components to characterize MEMS structures 100 according to the present invention. The preferred method incorporates four components. The first component comprises a preferred method to cover unknown parameters 200. The first component 200 establishes maximal and minimal trial values for selected geometric parameters of a selected type of MEMS structure, the actual values of which resulting from device fabrication are unknown and are desired to be determined. The first component 200 also creates a set of sample geometries for the selected type of MEMS structure, within the range of established minimum and maximum trial values, and performs other functions which are described in detail below.

The second component is a preferred method to generate a solid model 300. The second component 300 creates a 3D solid model for each of the sample geometries generated by the first component 200 using a nominal device fabrication process description. The details of the second component are described below.

The third component is a preferred method to perform numerical analyses 400. The third component 400 computes numerical solutions on each solid model generated by the second component 300 to calculate a selected response to an input stimulus. In the presently preferred embodiment, the selected response is a device performance parameter or characteristic, such as a set of natural frequencies. Preferably, the selected response is one which can be both calculated and readily physically measured and observed experimentally. The details of the the third component are described below.

The fourth component is a preferred method to compute unknown parameters 500. The fourth component 500 compares the set of calculated responses, e.g., natural frequencies calculated by the third component 400, with a set of experimentally observed responses, e.g., experimentally measured natural frequencies of the fabricated sample geometries. Using a conventional identification method such as taught in Reference [11], a set of characterized parameters is obtained that closely approximates the set of unknown parameters, i.e., the unknown values of selected geometric parameters or unknown values of selected material parameters or unknown values of selected process description parameters of the actually fabricated samples. The method to characterize MEMS structures 100 thus produces a highly accurate approximation of a set of unknown geometries using an easy to use, nondestructive, insitu test procedure. Each of the component methods is now described in further detail.

Figure 2:
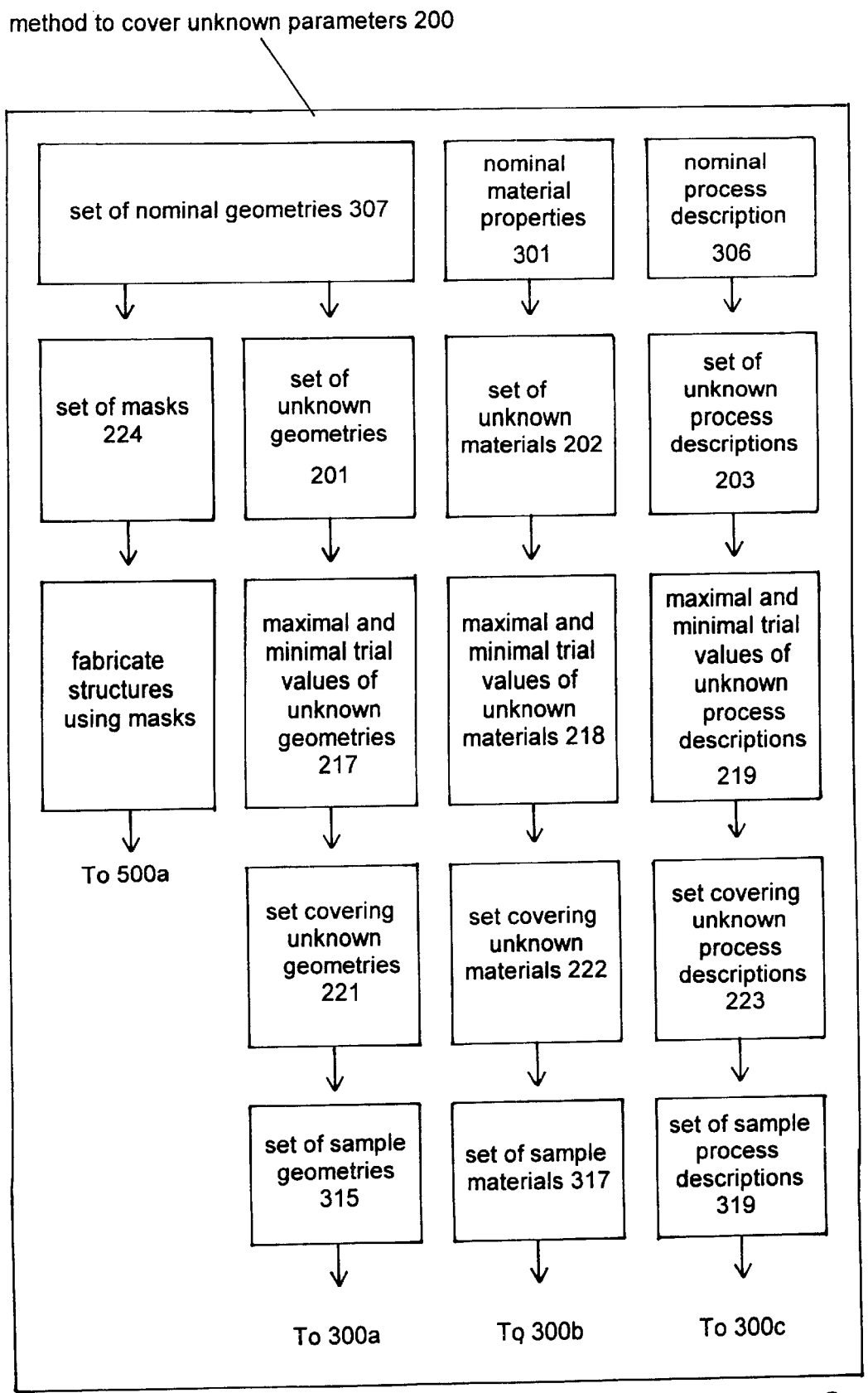
FIG. 2 is a flowchart of a preferred detailed method and components to cover unknown parameters as identified in FIG. 1.
Figure 7:
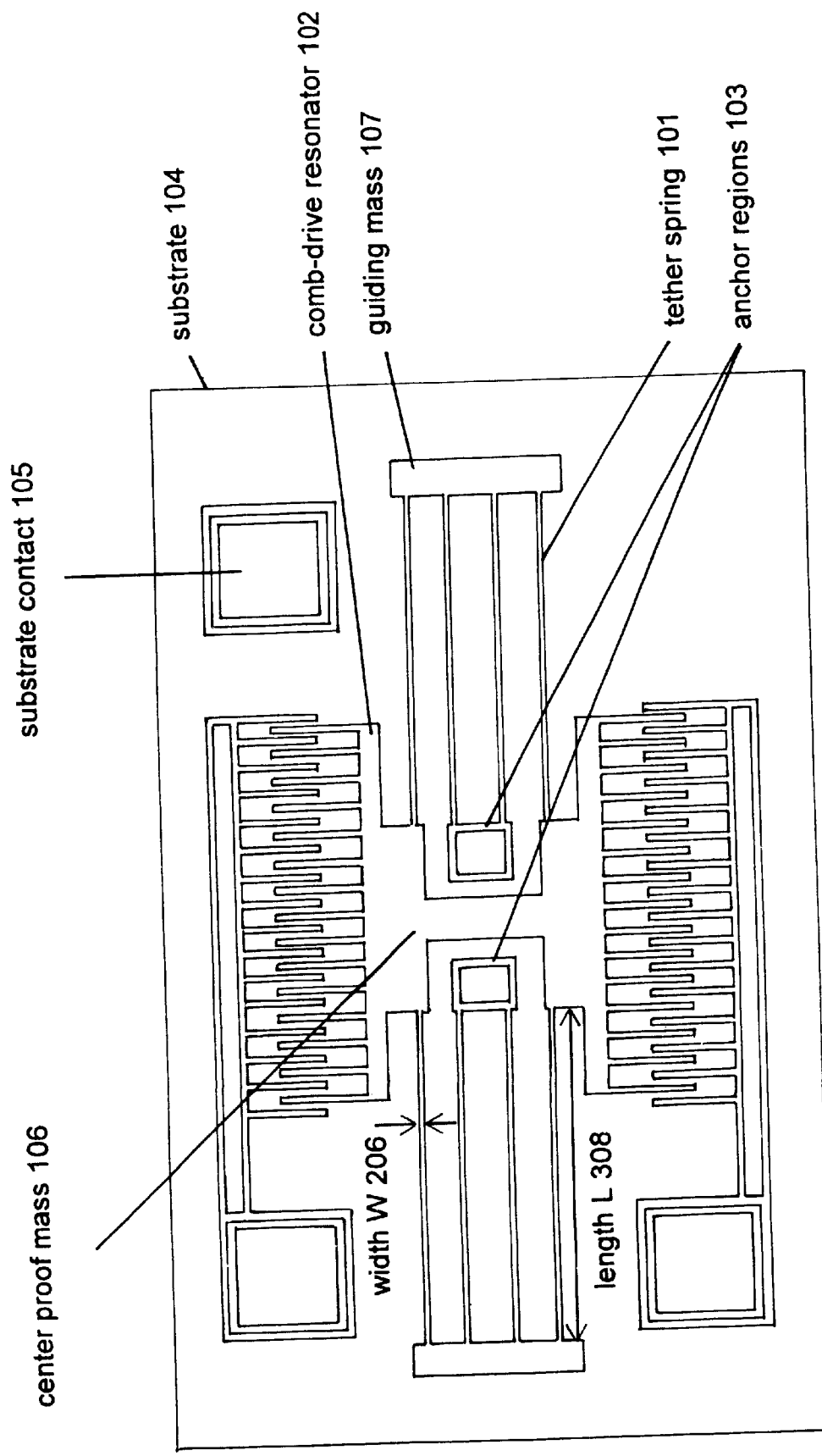
FIG. 7 shows a mask layout for an exemplary comb-drive resonator 102 with underlying anchor regions 103 on substrate 104, and having opposing fixed fingers for actuation and detection.
Figure 8:
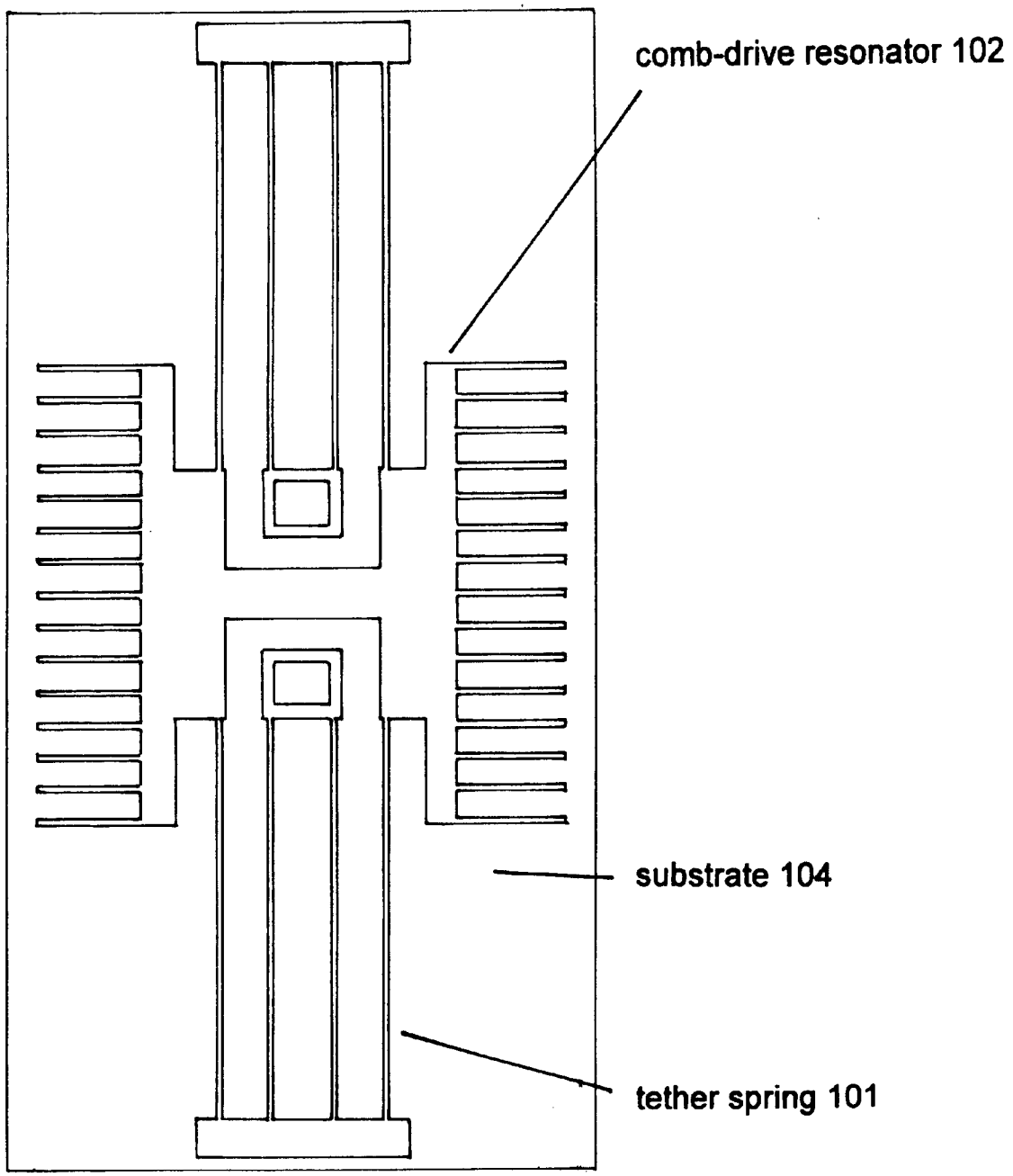
FIG. 8 shows a mask layout of an exemplary comb-drive resonator 102 extracted from the mask layout of FIG. 7.
Figure 10A:
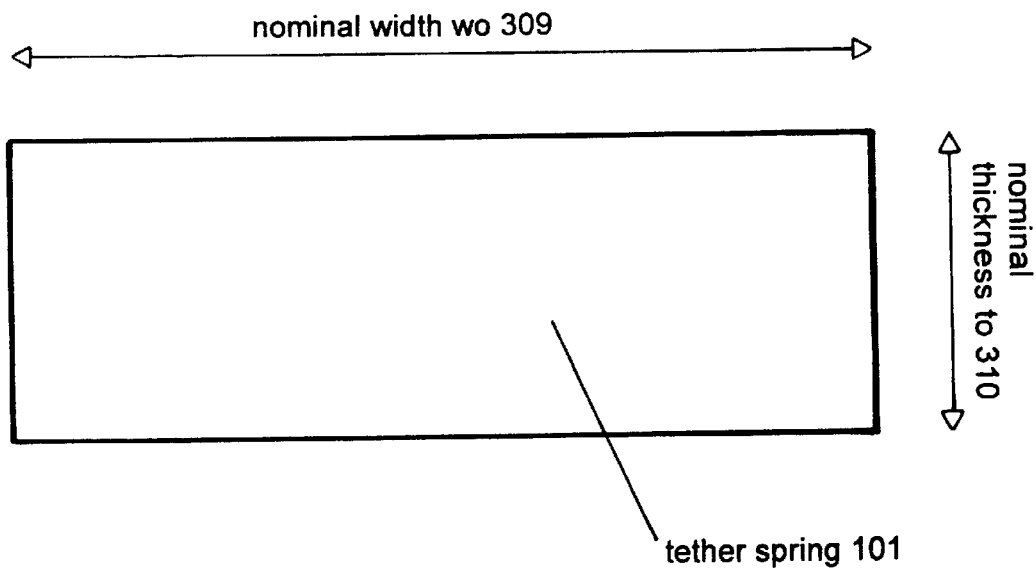
FIG. 10a is a cross-sectional view of a tether spring structure 101 as illustrated in FIGS. 7–9 with nominal geometric and process description parameters.
Figure 10B:
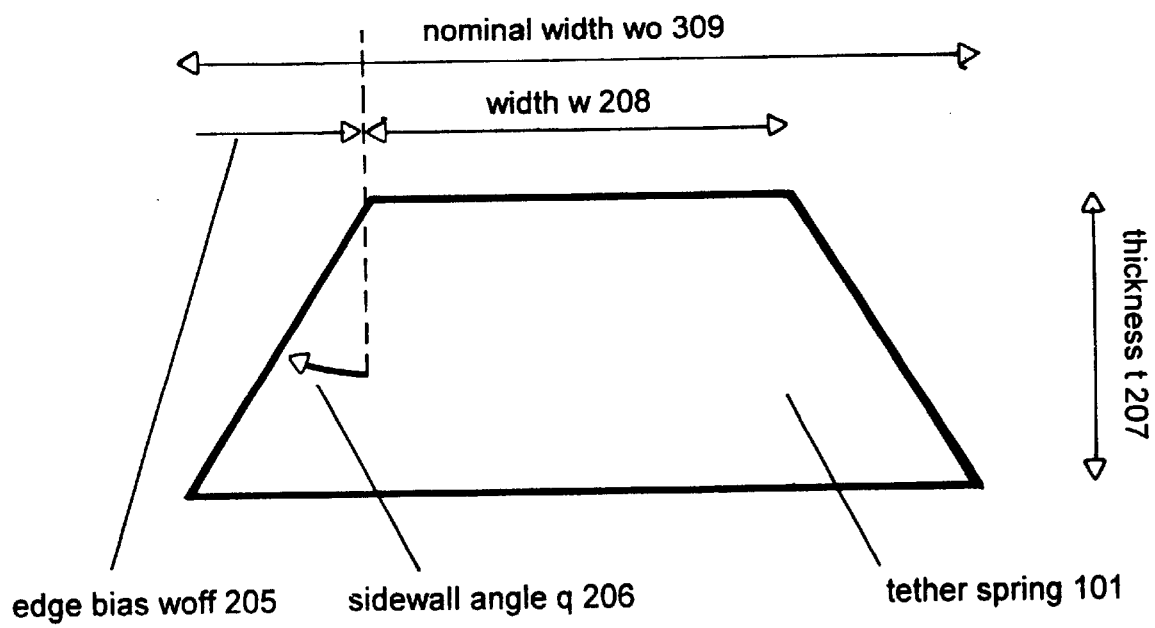
FIG. 10b is a cross-sectional view of the tether spring structure 101 as fabricated showing an edge bias woff 205 (which is negative for recessed walls at the top edge) and a sidewall angle $\theta$ 206 generated during device fabrication, relative to nominal mask width w208.

FIG. 2 illustrates the details of the first method component, the preferred method to cover unknown parameters 100. The method to cover unknown parameters employs a design in the form of a device layout. A set of nominal geometries 307 are preferably obtained from a 2D MEMS photolithographic layout 104, such as shown in FIGS. 7–8, and a nominal device fabrication process description 306. Examples of nominal geometries from the photolithographic layout 104 in FIGS. 7 and 8 include: nominal length L 308, nominal width wo 309 (equal to mask width 208), nominal thickness to 310, and nominal gap go 311. Examples of nominal material properties 301 include: poisson's ratio $v$, modulus of elasticity E, residual stress $\sigma_0$, and density $\rho$. Examples of nominal process description properties as shown in FIG. 10 include: edge bias woff 205 and sidewall angle $\theta$206. Conventional methods may be used to obtain initial estimates of material properties such as taught in Reference [1].

As a result of imperfect fabrication processes and process variations, the structures actually fabricated using the nominal photolithographic layout and the nominal process description may have geometric dimensions slightly different than the intended set of nominal geometries 307, material properties slightly different than the intended nominal material properties 301, and process description properties slightly different than the nominal process description properties 306. For example an unintended underetch edge bias woff 205 or sidewall angle $\theta$ 206 in a spring component, as shown in FIG. 10, can substantially affect the mass and stiffness of the fabricated MEMS structure, and substantially alter device performance and characteristics from nominal design and target specifications. These unknown variations from nominal comprise a set of unknown geometries 201, unknown materials 202, and unknown process descriptions 203.

The relationships between material and geometric parameters and device performance parameters for a number of typical MEMS structures are described in FIG. 6. Those skilled in the art will readily realize that even minor variations in certain geometric parameters result in dramatic variations in the performance parameters of many typical MEMS structures. It is therefore critical to characterize the differences between actual fabricated geometric parameters and nominal design parameters.

The range over which the unknown values of the selected geometric parameters may vary in devices to be fabricated is estimated. A minimum and a maximum trial value 217 are assigned to correspond to the expected lower and upper limit of variation respectively. Within the range established by the minimum and maximum trial values, a set of trial values is generated to cover the entire expected range of variation of unknown geometries 221 including the maximal and minimal trial values. As is well known in the design of experiments such as taught by Reference [12], the trial values may be an arbitrary selection or linear increments or logarithmic increments or a combination. The number of trial values in the range may be increased if the MEMS structure is sensitive to this parameter, or decreased if the MEMS structure is insensitive to this parameter.

From the set of trial values covering the unknown geometries 221, a set of sample geometries 315 is created. Each sample geometry in the set is represented by and has a corresponding sample photolithographic layout such as layout 104 shown in FIG. 8. Thus, a set of photolithographic masks 224 for fabricating a set of sample structures embodying the entire range of sample geometric trial values is generated 225.

Similarly, the minimum and maximum values between which the values of material properties may vary from nominal in the structures to be fabricated is estimated 218 and a range of variation thereby estimated. A set of trial values covering the entire range of variation, and encompassing the maximal and minimal trial values is generated 222. From the set of trial values covering unknown materials 222 a set of sample materials 317 is created. Each sample material in the set 317 is represented by and has a corresponding set of sample material property values, such as Poisson's ratio, modulus of elasticity, residual stress, and density.

Similarly, the range over which the values of the parameters of the nominal fabrication process description may vary during actual fabrication is estimated 219 and a set of trial values covering the entire range of variation, including maximal and minimal trial values, is generated 223. The set of trial values covering the range of unknown variations from the nominal process descriptions allows a set of sample process descriptions 319 to be created, where each process description in the set of sample process descriptions 319 represents a sample process description.

Preferably there is no fixed correlation between each sample geometry, sample material and sample process description. Any trial values describing a sample geometry, a sample material and a sample process description can be combined to form a solid model of a possible MEMS structure. However, preferably only those combinations which are expected to be present in the fabricated structures need to be considered.

Figure 3:
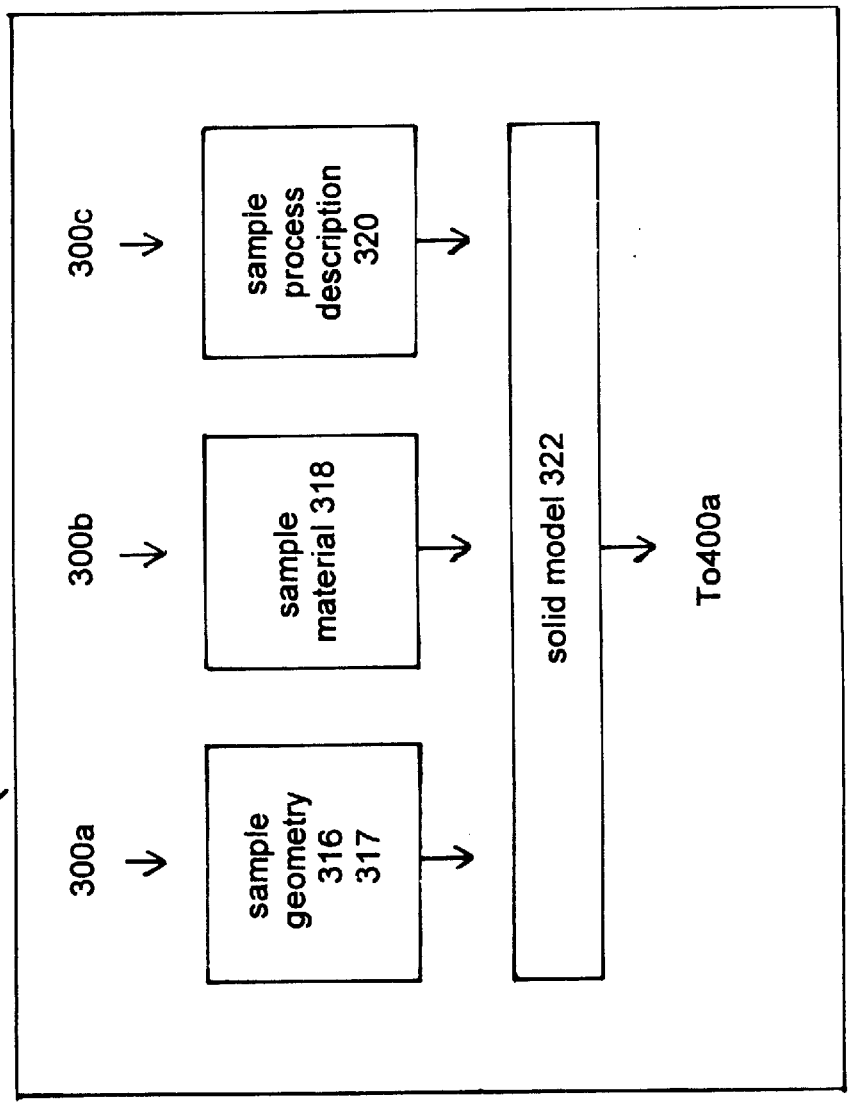
FIG. 3 is a flowchart of a preferred detailed method and components to generate a solid model as identified in FIG. 1.
Figure 9:
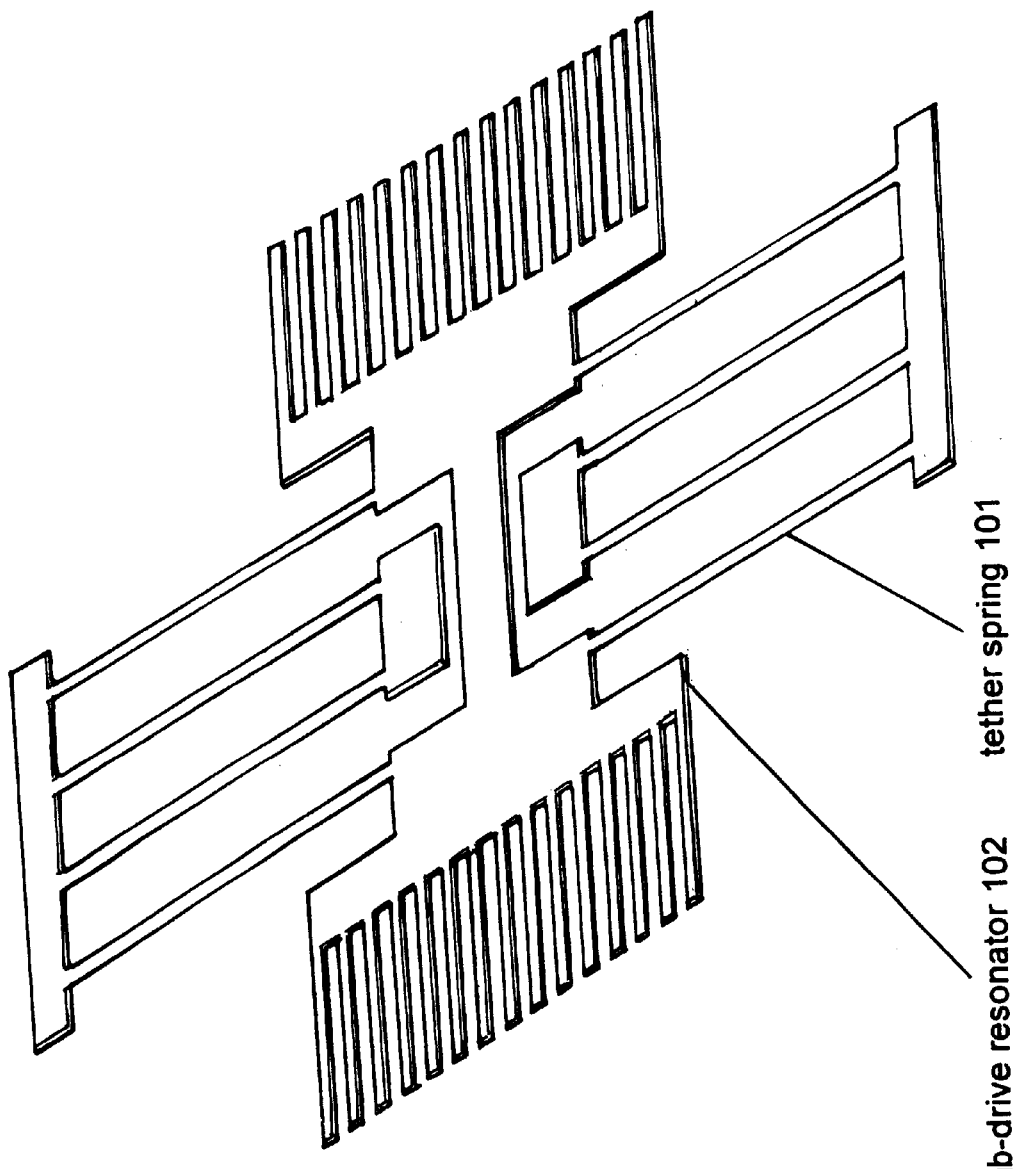
FIG. 9 shows a solid model of a surface micromachined, polysilicon comb-drive resonator used to illustrate a preferred form of the inventive approach and apparatus and based on nominal geometry and conformal deposition from the mask layout of FIG. 8.

FIG. 3 illustrates the details of the second method component, the preferred method to generate a solid model 300. The combination of a sample geometry 316 from the set of sample geometries 315, a sample material 318 from the set of sample materials 317, and a sample process description 320 from the set of sample process descriptions 319 generated by the first component 200 forms the basis for generating a 3D solid model 322 using the method to generate solid model 300. Preferably, a surface-based or volume-based solid model 322 is generated for each combination of sample geometry 316, sample material 318 and sample process description 320. As is well known, possible model generation methods include emulation of the fabrication process using extrusion or simulation of the fabrication process using. numerical solvers. In the present invention, the generation of a solid model using emulation of the fabrication process as implemented by Reference [10] is preferred resulting in a solid model of a comb-finger MEMS structure such as shown in FIG. 9.

Figure 4:
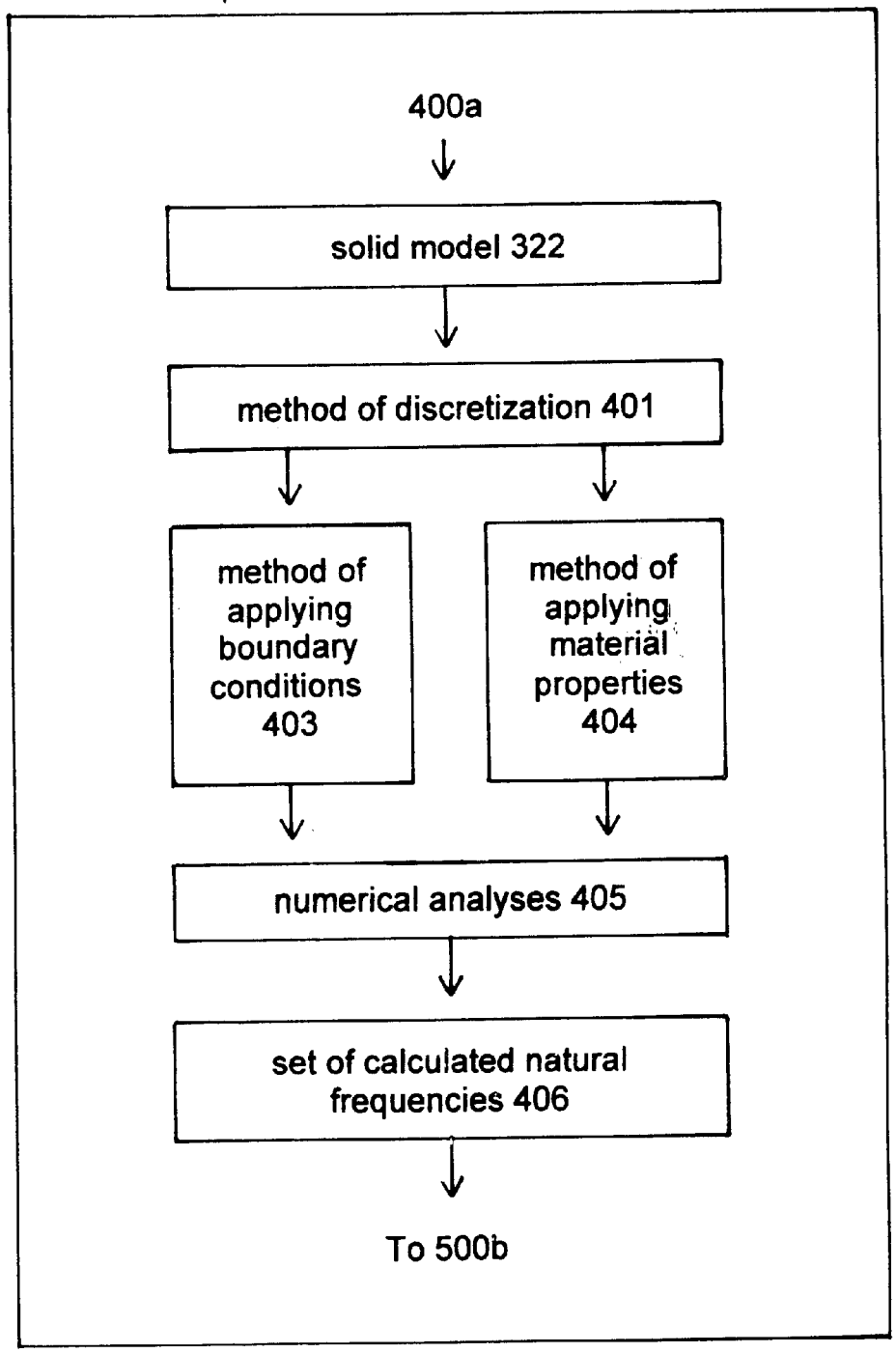
FIG. 4 is a flowchart of a preferred detailed method and components to perform numerical analyses as identified in FIG. 1.

FIG. 4 illustrates the details of the third method component, the preferred method to perform numerical analyses 400. The third method component discretizes the surface or volume of each surface-based or volume-based solid model 322 generated by the second method component 300 using an appropriate method of discretization 401. Both surface and volume discretization methods are well known to those skilled in the art. Surface discretization is commonly used for boundary element method numerical analysis, and volume discretization is commonly used for finite element method and finite difference method numerical analysis. Each model generated by the second method component 300 is discretized as described. In the present invention, the discretization of a solid model using volume discretization as implemented by Reference [10] is preferred. The discretization forms a discretized model suitable for numerical analyses.

Appropriate boundary conditions (such as prescribed forces or displacements) are applied to the discretized model using an appropriate method of applying boundary conditions 403. For example in the preferred embodiment utilizing a comb-finger MEMS structure, appropriate boundary conditions would be zero displacements on the anchors and non-zero forces on the comb-finger structure. Each separate volume of the discretized model containing a unique material is identified, and the appropriate material parameters are applied with an appropriate method of applying material properties 404. For example in the preferred embodiment utilizing a comb-finger MEMS structure, appropriate material parameters could include modulus of elasticity, poisson's ratio, density, coefficient of temperature expansion and residual stress.

Figure 11A:
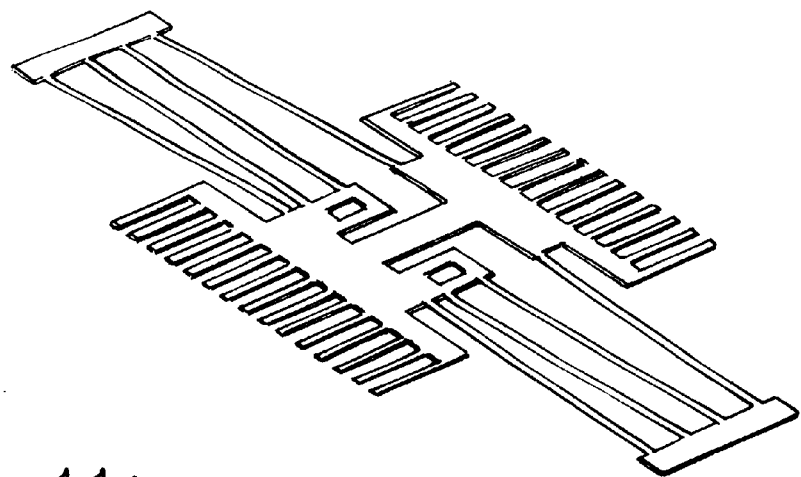
FIG. 11a, FIG. 11b, and FIG. 11c show MEMCAD graphics simulation outputs of the first three distinct resonant frequencies, i.e., lateral natural frequency fH, lateral natural frequency fL, and torsional natural frequency fT of the comb-drive resonator 102 of FIGS. 8 and 9.
Figure 11B:
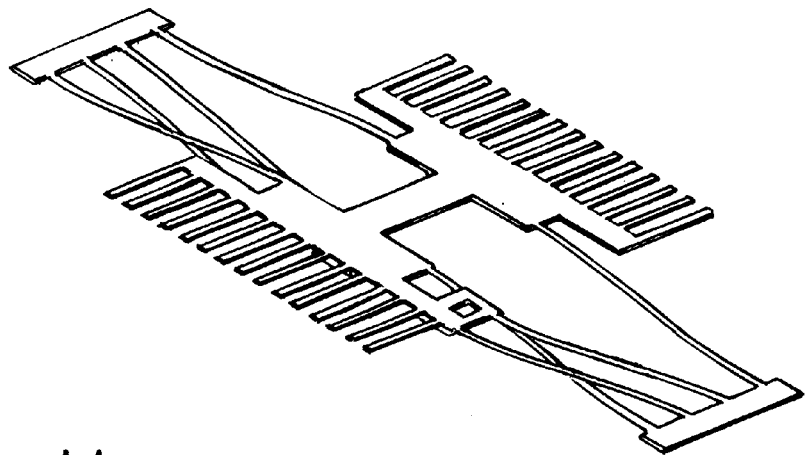
Figure 11C:
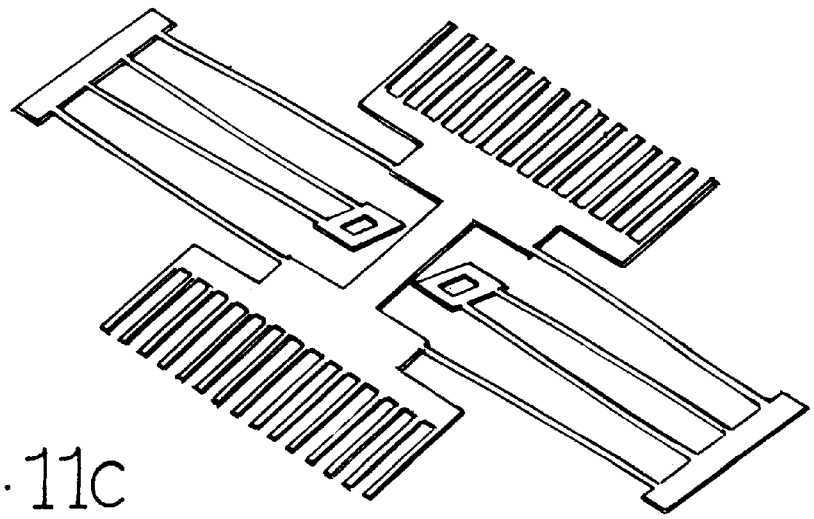
Figure 12A:
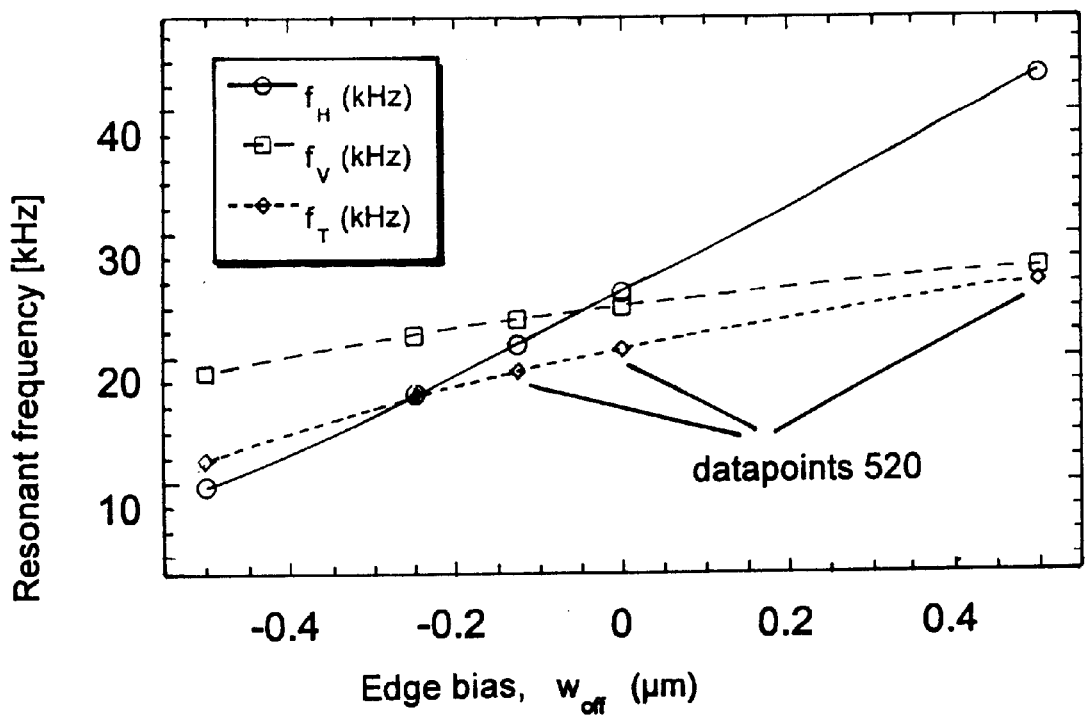
FIG. 12a is a graph showing the sensitivity of the lateral natural frequency fH, lateral natural frequency fL, and torsional natural frequency fT of the comb-drive resonator of FIGS. 8 and 9 to variations in edge bias woff.
Figure 12B:
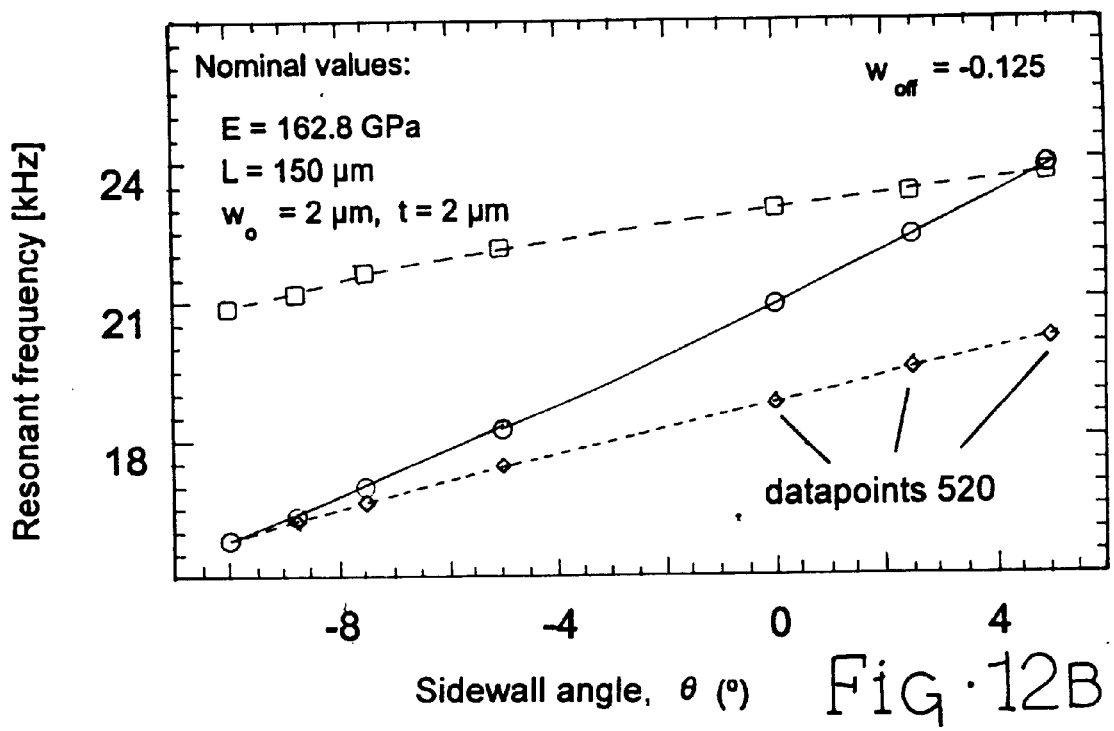
FIG. 12b is a graph showing the sensitivity of a set of calculated natural frequencies to variations in sidewall angle $\theta$ 206 of the tether spring structure of FIG. 10.

Appropriate numerical analyses 405 are carried out on each model using, for example, finite difference analysis, finite element analysis or boundary element analysis techniques to obtain a response to the boundary conditions. Each of these numerical analysis methods are well known to those skilled in the art. In the preferred embodiment, finite element method is utilized as implemented by Reference [10]. In the prefered embodiment the response is a set of calculated natural frequencies 406 comprising the lowest natural frequencies and associated eigenmodes. Preferably, a set of calculated natural frequencies 406 such as lateral, vertical and torsional eigenmodes as shown in FIGS. 11a, 11b and 11c is computed for each sample solid model 322 by numerical analysis. Examples of lateral, vertical and torsional natural frequency sensitivity to process parameters edge bias woff 205 and sidewall angle 206 are shown in FIGS. 12a and 12b. Each datapoint 520 represents an exemplary trial value of the process description parameter.

Figure 5:
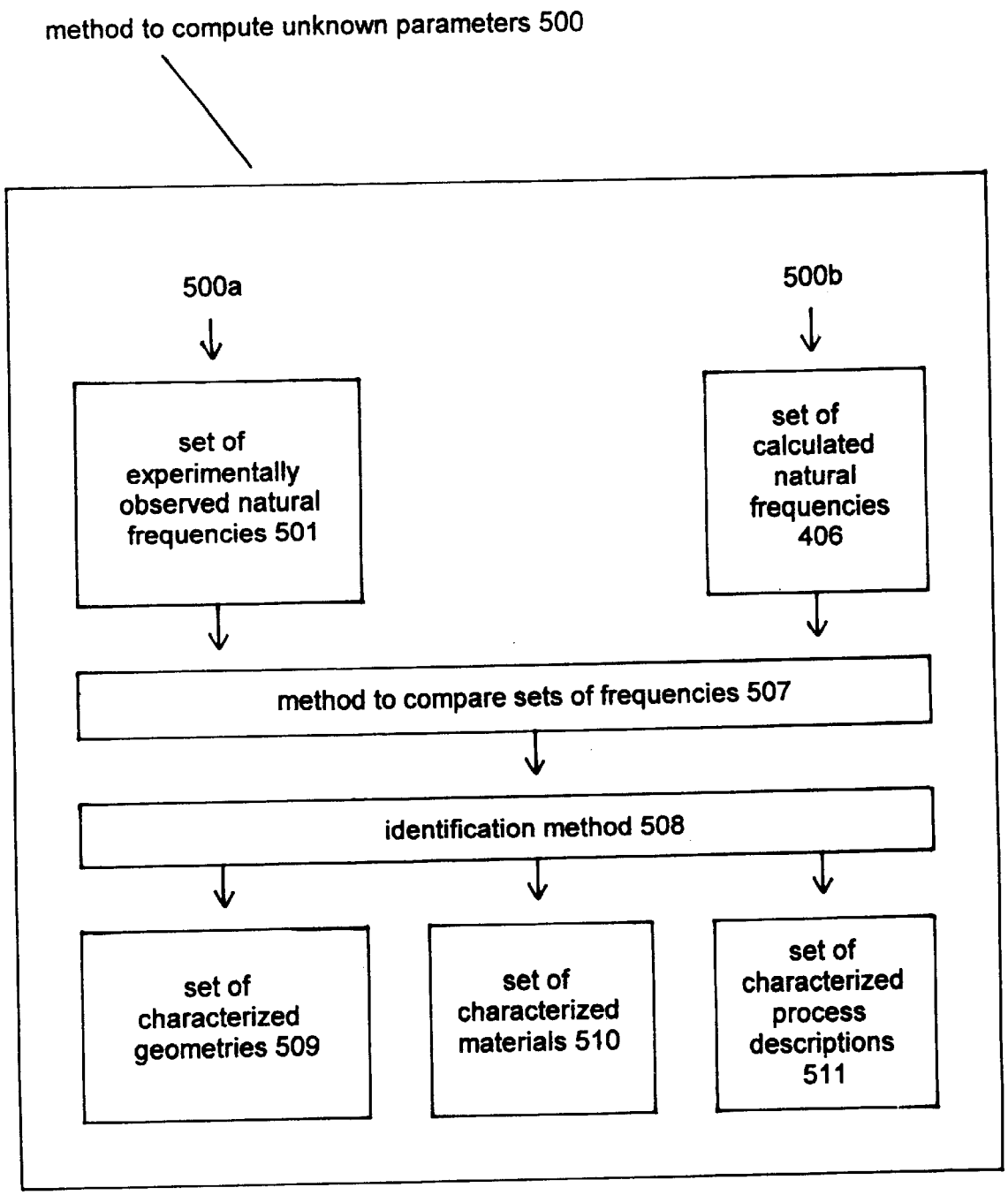
FIG. 5 is a flowchart of a preferred detailed method and components to compute the values of unknown parameters as identified in FIG. 1.

FIG. 5 illustrates the details of the fourth method component, the preferred method to compute unknown parameters 500. The fourth component 500 assumes a set of test structures has been fabricated using the set of sample process descriptions, sample geometries, and sample materials generated in the first component, and that the natural frequencies of each of the test structures has been experimentally measured and observed 501. Preferably all test structures should be fabricated using the same process description and on the same wafer. The set of experimentally observed natural frequencies 501 together with the set of calculated natural frequencies 406 generated by the third method component 400 comprise the input data to the fourth method component 500.

An identification method 508 is used to obtain numerical values for each parameter in the set of unknown geometries 201, the set of unknown materials 202 and the set of unknown process descriptions 203. These numerical values characterize the fabricated MEMS structure in terms of the earlier unknown geometric, material and process description parameters and comprise a set of characterized geometries 509, characterized materials 510, and characterized process descriptions 511.

A method to compare sets of frequencies 507 results in an error measure between the set of experimentally observed natural frequencies 501 of the fabricated structures and the set of calculated natural frequencies 406 for each sample solid model 322. Many forms of error measures are known to those skilled in the art, such as the sum of the squares of the differences between the observed and calculated natural frequencies. The error measure between the experimentally observed values and the calculated values of solid models associated with trial values are calculated. The identification method 508 minimizes the error measure, preferably obtaining numerical values for the unknown parameters by interpolation from the trial values. The numerical values thus provide a very high accuracy approximation to the unknown parameters. In the preferred embodiment, a nonlinear least-squares curve fit is used to minimize the error between the set of characterized geometries 509 and the set of unknown geometries 201, the set of characterized materials 510 and the set of unknown materials 202 and the set of characterized process descriptions 511 and the set of unknown process descriptions 203. In the preferred embodiment of the present invention, an identification method 508 using for example, a non-linear least-squares curve fit based on the Levenberg-Marquardt method is utilized (See reference [11]).

Figure 13:
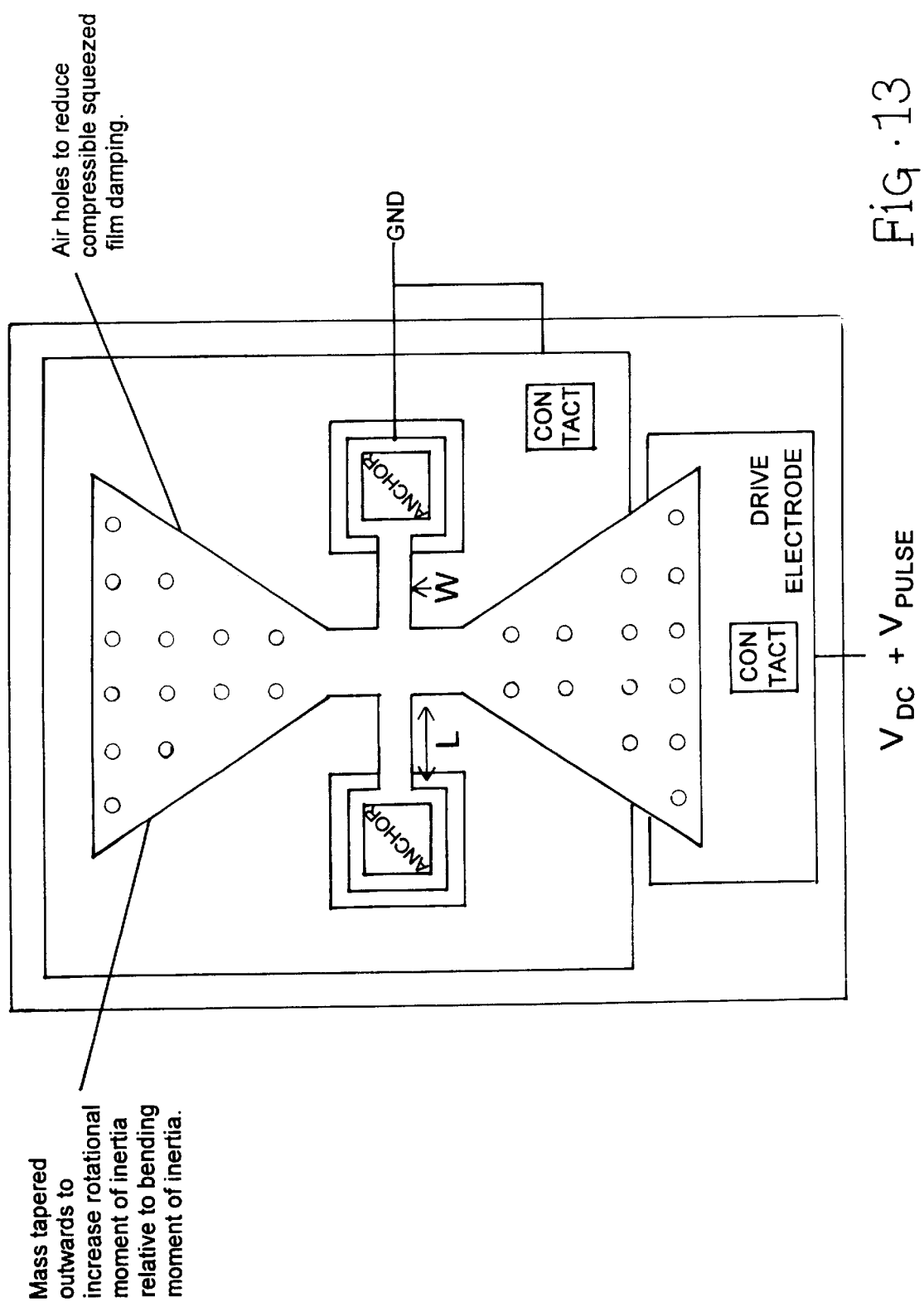
FIG. 13 is a plan view of an exemplary torsional resonator mask design which can be used for measuring variations in film thickness from nominal thickness to employing the preferred approach of the invention.

The features and advantages of the present invention have been illustrated with reference to the foregoing detailed description of a presently preferred embodiment. Those skilled in the art will realize that numerous variations can be made to the preferred embodiment without varying from the spirit of the invention. For example additional micromechancial structures can be implemented for measuring film thickness and electrostatic gaps which deviate from the nominal values. As with the laterally resonating structures, the structures utilize variations in a mask-drawn geometry to ascertain the necessary parameters fitting the solid models to the experimentally observed data. Alternate MEMS structures such as the one shown in the FIG. 13 depicts a torsional resonator which allows measurement of thickness variations using varying width design. In this case, the mechanical stiffness via the torsional moment of area is a unique and independent function of both thickness and width. The foregoing description is therefore not intended to limit the scope of the invention, which is defined solely by the appended claims.

What is claimed is:

1. A method of characterizing microelectromechanical structures, said method comprising the steps of:
    (a) specifying a set of one or more parameters of unknown value;
    (b) specifying a set of trial values for each parameter;
    (c) defining a set of sample geometries using said trial values;
    (d) fabricating a set of test structures corresponding to said sample geometries and experimentally obtaining a selected observed response to a selected stimulus;
    (e) numerically analyzing said sample geometries to obtain a computed response to said selected stimulus;
    (f) calculating an error measure between said observed response and said computed response; and
    (g) computing unknown values for said parameters related to said error measure.

2. A method as in claim 1 wherein said parameters include at least one parameter from the group:
    edge bias, sidewall angle, thickness, modulus of elasticity, poisson's ratio and residual stress.

3. A method as in claim 2 wherein each said trial value includes at least one numeric estimate of an unknown value of said parameter.

4. A method as in claim 3 wherein said step of defining a set of sample geometries comprises:
    generating a sample geometry for each trial value.

5. A method as in claim 1 wherein said observed response comprises natural frequency and wherein said computed response comprises natural frequency analysis.

6. A method as in claim 5 wherein said step of calculating an error measure comprises:
    calculating the difference between the observed natural frequency and computed natural frequency for each geometry in the set of sample geometries;
    and summing the differences for the set of sample geometries.

7. A method as in claim 1 wherein said step of computing unknown values for said parameters comprises:
    minimizing said error measure between said observed and computed responses for said set of trial values.

8. A method as in claim 7 wherein said step of minimizing the error measure comprises:
    a least squares optimization.

9. A computer system for characterizing microelectromechanical structures, said computer system comprising:
    (a) means for specifying a set of one or more parameters having unknown values;
    (b) means for specifying a set of trial values for each parameter;
    (c) means for defining a set of sample geometries using said trial values;
    (d) means for numerically analyzing said sample geometries to compute natural frequencies;
    (e) means for calculating an error measure between experimentally observed natural frequencies of devices corresponding to said sample geometries and said computed natural frequencies; and
    (f) means for computing said unknown values for said parameters related to said error measure.

10. A computer program residing on a computer readable medium for causing a computer to characterize a microelectromechanical structure, comprising computer instructions for:
    (a) specifying a set of one or more parameters having unknown values;
    (b) specifying a set of trial values for each parameter;
    (c) defining a set of sample geometries using said trial values;
    (d) numerically analyzing said sample geometries to compute natural frequencies;
    (e) calculating an error measure between experimentally observed natural frequencies of devices corresponding to said sample geometries and said computed natural frequencies; and
    (f) computing said unknown values for said parameters related to said error measure.

11. A method of characterizing microelectromechanical structures, said method comprising the steps of:
    (a) specifying a set of one or more parameters of unknown value;
    (b) specifying a set of trial values for each parameter;
    (c) defining a set of sample geometries using said trial values;
    (d) fabricating a set of test structures corresponding to said sample geometries and experimentally obtaining a selected observed response including a natural frequency to a selected stimulus;
    (e) numerically analyzing said sample geometries to obtain a computed response including a natural frequency to said selected stimulus;
    (f) calculating a difference between the observed natural frequency and computed natural frequency;
    (g) summing the differences for the set of sample geometries to generate an error measure; and
    (h) computing unknown values for said parameters related to said error measure.

12. A computer system for characterizing microelectromechanical structures, said computer system comprising:
    (a) means for specifying a set of one or more parameters having unknown values;
    (b) means for specifying a set of trial values for each parameter;
    (c) means for defining a set of sample geometries using said trial values;
    (d) means for numerically analyzing said sample geometries to compute natural frequencies;
    (e) means for calculating a difference between experimentally observed natural frequencies of devices corresponding to said sample geometries and said computed natural frequencies;
    (f) means for summing the differences for the set of sample geometries to generate an error measure; and (g) means for computing said unknown values for said parameters related to said error measure.

13. A computer program residing on a computer readable medium for causing a computer to characterize a microelectromechanical structure, comprising computer instructions for:

(a) specifying a set of one or more parameters having unknown values;

(b) specifying a set of trial values for each parameter;

(c) defining a set of sample geometries using said trial values;

(d) numerically analyzing said sample geometries to compute natural frequencies;

(e) calculating a difference between experimentally observed natural frequencies of devices corresponding to said sample geometries and said computed natural frequencies;

(f) summing the differences for the set of sample geometries to generate an error measure; and (g) computing said unknown values for said parameters related to said error measure.

* * * * *